(12) United States Patent
Huang et al.

(10) Patent No.: US 11,881,409 B2
(45) Date of Patent: Jan. 23, 2024

(54) METHOD OF CUTTING FIN

(71) Applicant: UNITED MICROELECTRONICS CORP., Hsin-Chu (TW)

(72) Inventors: Wei-Hao Huang, New Taipei (TW); Chun-Lung Chen, Tainan (TW); Kun-Yuan Liao, Hsinchu (TW); Lung-En Kuo, Tainan (TW); Chia-Wei Hsu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 297 days.

(21) Appl. No.: 17/359,669

(22) Filed: Jun. 28, 2021

(65) Prior Publication Data

US 2022/0384200 A1 Dec. 1, 2022

(30) Foreign Application Priority Data

May 28, 2021 (CN) .......................... 202110589682.4

(51) Int. Cl.
*H01L 21/308* (2006.01)
*H01L 21/306* (2006.01)
*H01L 21/027* (2006.01)
*G03F 1/38* (2012.01)

(52) U.S. Cl.
CPC ...... *H01L 21/3085* (2013.01); *H01L 21/0274* (2013.01); *H01L 21/30604* (2013.01); *G03F 1/38* (2013.01)

(58) Field of Classification Search
CPC ............ H01L 21/3085; H01L 21/0274; H01L 21/30604; G03F 1/38
See application file for complete search history.

(56) References Cited

U.S. PATENT DOCUMENTS

| 7,202,148 | B2 | 4/2007 | Chen | |
| 8,946,078 | B2* | 2/2015 | Chen | H01L 29/66795 |
| | | | | 257/E21.546 |
| 9,455,202 | B2* | 9/2016 | Lee | G03F 1/00 |
| 2013/0228862 | A1* | 9/2013 | Lee | H01L 29/66636 |
| | | | | 257/E21.409 |
| 2021/0335787 | A1* | 10/2021 | Huang | H01L 21/31144 |

* cited by examiner

*Primary Examiner* — Eduardo A Rodela
(74) *Attorney, Agent, or Firm* — Winston Hsu

(57) ABSTRACT

A method of cutting fins includes the following steps. A photomask including a snake-shape pattern is provided. A photoresist layer is formed over fins on a substrate. A photoresist pattern in the photoresist layer corresponding to the snake-shape pattern is formed by exposing and developing. The fins are cut by transferring the photoresist pattern and etching cut parts of the fins.

8 Claims, 5 Drawing Sheets

METHOD OF CUTTING FIN

BACKGROUND OF THE INVENTION

1. Field of the Invention

The present invention relates to a method of cutting fins, and more particularly, to a method of cutting fins applying photomasks including snake-shape patterns.

2. Description of the Prior Art

With increasing miniaturization of semiconductor devices, various multi-gate MOSFET devices have been developed. The multi-gate MOSFET is advantageous for the following reasons. First, manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased. In multi-gate MOSFET processes, fin structures are formed on a substrate and gate structures are disposed over the fin structures, and fin cutting processes are processed to form integrated circuit layouts.

SUMMARY OF THE INVENTION

The present invention provides a method of cutting fins, which applies photomasks including snake-shape patterns to cut fins, to avoid fin damage.

The present invention provides a method of cutting fins including the following steps. A photomask including a snake-shape pattern is provided. A photoresist layer is formed over fins on a substrate. A photoresist pattern is formed in the photoresist layer corresponding to the snake-shape pattern by exposing and developing. The fins are cut by transferring the photoresist pattern and etching cut parts of the fins.

According to the above, the present invention provides a method of cutting fins, which provides a photomask including a snake-shape pattern, forms a photoresist layer over fins on a substrate, exposes and develops to form a photoresist pattern in the photoresist layer corresponding to the snake-shape pattern, cuts the fins by transferring the photoresist pattern and etching cut parts of the fins. By using the photomask including the snake-shape pattern, fin damage caused by exposing failure or over-exposing using a photomask only having island patterns or pot patterns can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
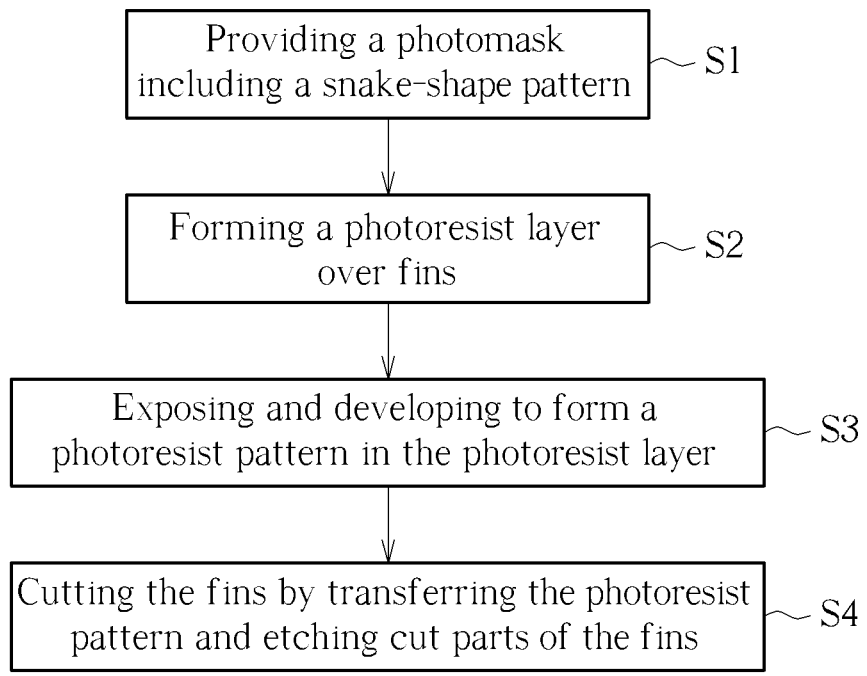
FIG. 1 schematically depicts a flow chart of a method of cutting fins according to an embodiment of the present invention.
Figure 2:
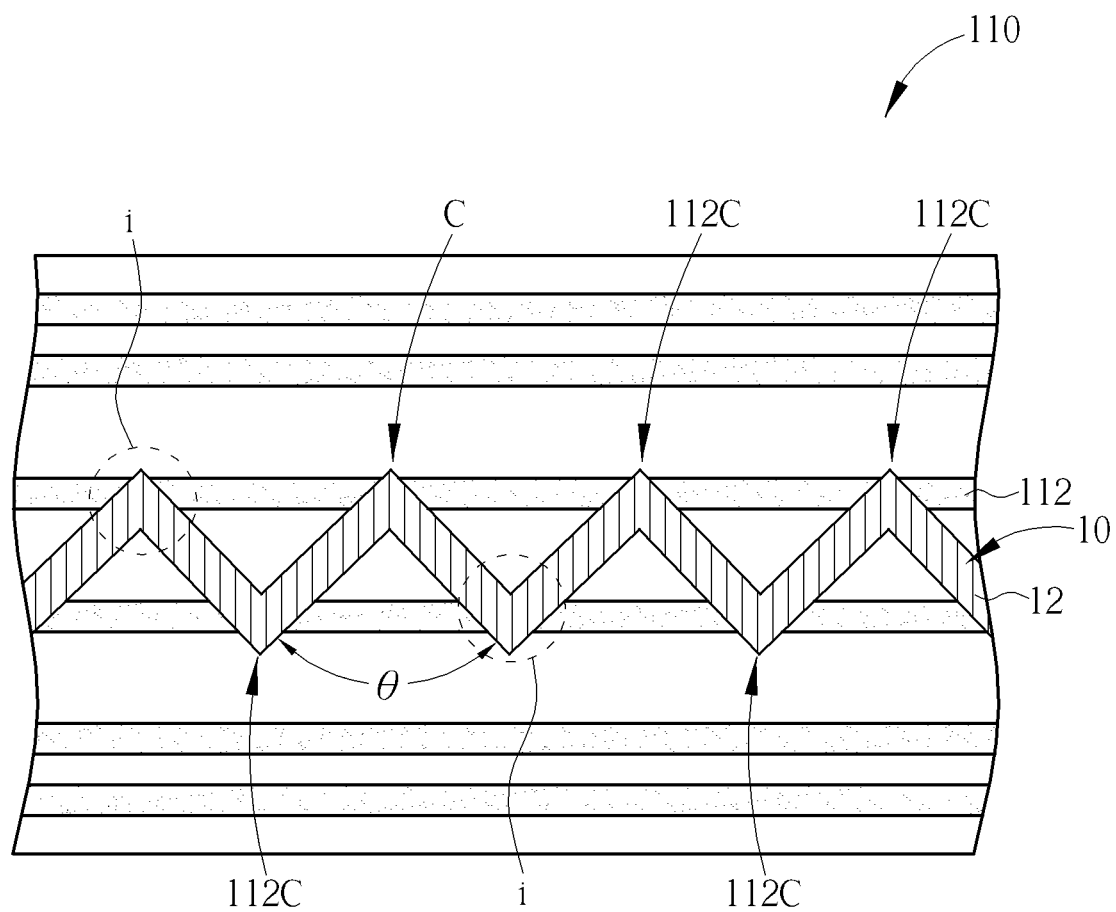
FIG. 2 schematically depicts a top view of a photomask corresponding to fins in a method of cutting fins according to an embodiment of the present invention.

Please refer to FIG. 1 and FIG. 2, FIG. 1 schematically depicts a flow chart of a method of cutting fins according to an embodiment of the present invention, and FIG. 2 schematically depicts a top view of a photomask corresponding to fins in a method of cutting fins according to an embodiment of the present invention. According to a step S1 of FIG. 1—providing a photomask including a snake-shape pattern, a photomask 10 corresponding to fins 112 is provided, as shown in FIG. 2. The fins 112 are located on a substrate 110. Methods of forming the fins 112 may include the following steps, but the present invention is not restricted thereto. A bulk substrate (not shown) is provided, a hard mask (not shown) is formed on the bulk substrate, the hard mask is patterned, and the bulk substrate is etched using the hard mask, and thus fins 112 on the substrate 110 are formed. Then, the hard mask is removed.

In this embodiment, the photomask 10 includes a snake-shape pattern 12 for cutting the fins 112. As shown in FIG. 2, parts of the fins 112 overlapping the snake-shape pattern 12 are cut parts 112c. In other words, the snake-shape pattern 12 may include a plurality of island patterns i, wherein the island patterns i correspond to and overlap the cut parts 112c of the fins 112 for removing the cut parts 112c. Or, the snake-shape pattern 12 may include corners c, wherein these corners c may have different curved angles θ to connect the island patterns i individually. The curved angles θ depend on the size and the relative locations of the island patterns i. By replacing island patterns of a photomask with the snake-shape pattern 112 of the photomask 10 for cutting fins 112 in the present invention, fin damage caused by exposing failure or over-exposing using a photomask only having island patterns or pot patterns can be avoided.

Figure 5:
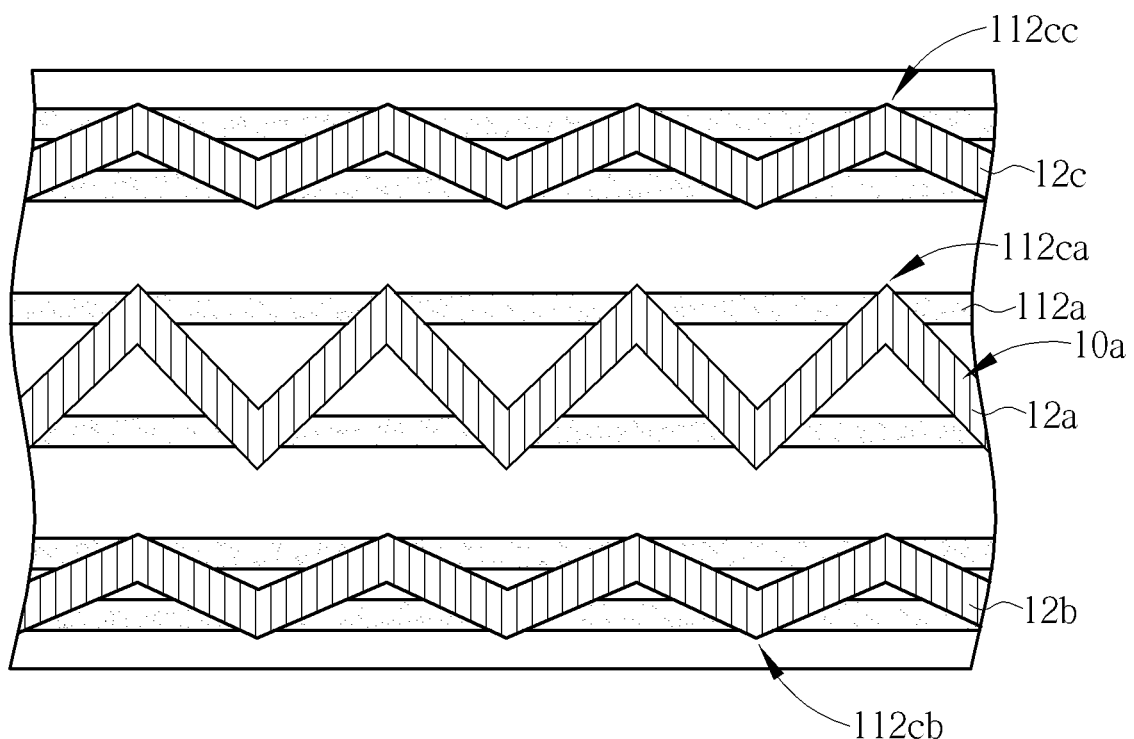
FIG. 5 schematically depicts a top view of a photomask corresponding to fins in a method of cutting fins according to another embodiment of the present invention.

In other embodiments, the photomask 10 may further include other patterns. FIG. 5 schematically depicts a top view of a photomask corresponding to fins in a method of cutting fins according to another embodiment of the present invention. As shown in FIG. 5, the photomask 10a includes a plurality of snake-shape patterns 12a/12b/12c to cut fins 112a. Each of the snake-shape patterns 12a/12b/12c of FIG. 5 may be common to or similar to the snake-shape pattern 12 of FIG. 2, or the snake-shape patterns 12a/12b/12c may be adjusted in accordance with cut parts of the fins 112.

Figure 3:
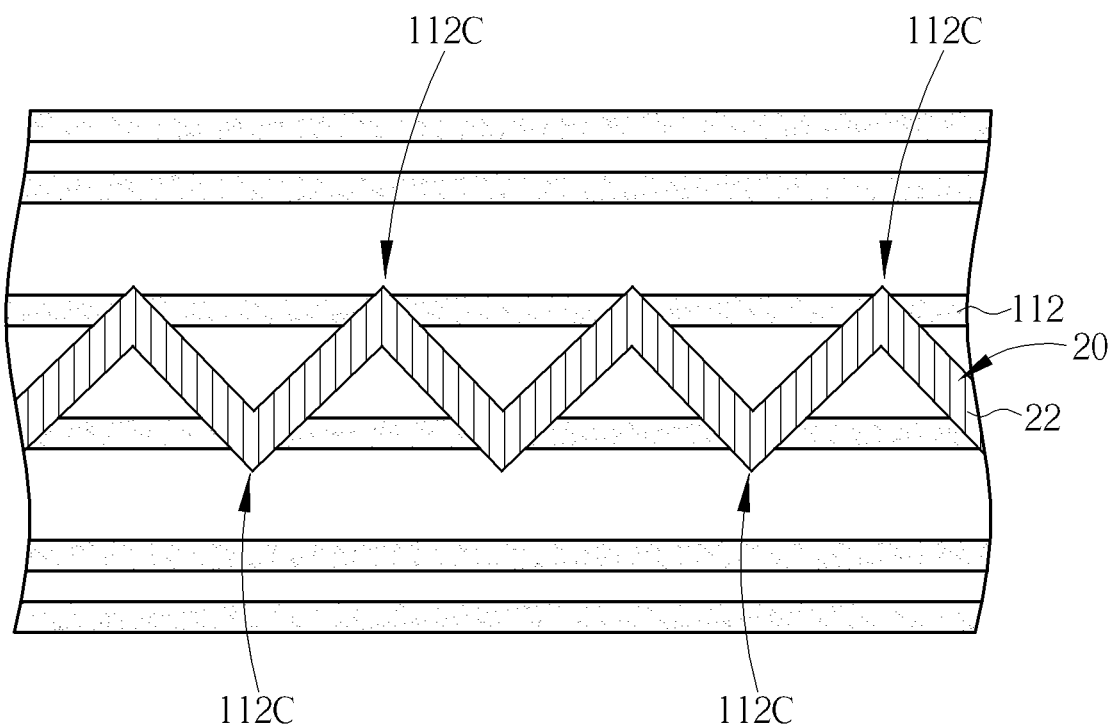
FIG. 3 schematically depicts a top view of a photoresist covering fins in a method of cutting fins according to an embodiment of the present invention.

Please refer to FIG. 2, the pattern of the photomask 10 is transferred to the fins 112 by a photoresist layer. FIG. 3 schematically depicts a top view of a photoresist covering fins in a method of cutting fins according to an embodiment of the present invention. According to a step S2 of FIG. 1—forming a photoresist layer over fins, a photoresist layer 20 covers the fins 112, as shown in FIG. 3.

According to a step S3 of FIG. 1—exposing and developing to form a photoresist pattern in the photoresist layer, a photoresist pattern 22 is formed in the photoresist layer 20 by exposing and developing, as shown in FIG. 3. Since the pattern of the photomask 10 is used to transfer to the fins 112, the pattern of the photomask 10 of FIG. 2 should be substantially common to the pattern of the photoresist layer 20 of FIG. 3. In this case, the snake-shape pattern 12 of the photomask 10 is transferred to the photoresist layer 20, and thus a snake-shape slot in the photoresist layer 20 is formed, but it is not limited thereto. In a preferred embodiment, the snake-shape slot (photoresist pattern) 22 overlaps the cut parts 112c of the fins 112 according to the photomask 10 for cutting the fins 112. In a still preferred embodiment, the snake-shape slot (photoresist pattern) 22 overlaps the cut parts 112c of the two adjacent fins 112 to remove the cut parts 112c of the two adjacent fins 112.

Figure 4:
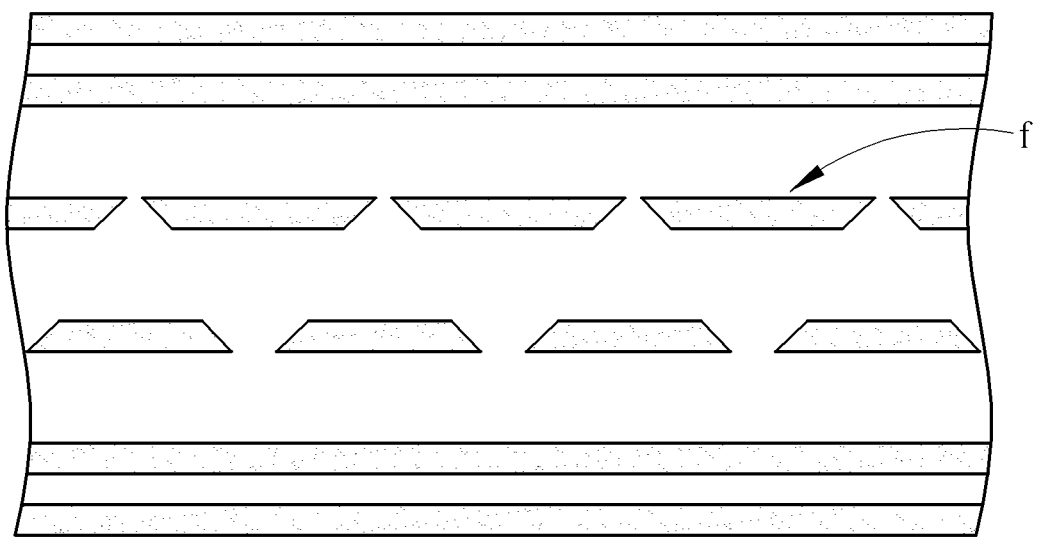
FIG. 4 schematically depicts a top view of fins after cutting according to an embodiment of the present invention.

According to a step S4 of FIG. 1—cutting the fins by transferring the photoresist pattern and etching cut parts of the fins, the fins 112 are cut by steps of FIG. 3-4. The photoresist pattern 22 of the photoresist layer 20 is transferred and the cut parts 112c of the fins 112 are etched to remove the cut parts 112c, and then the photoresist layer 20 is removed. Thus, cut fins f are formed, as shown in FIG. 4.

To summarize, the present invention provides a method of cutting fins, which provides a photomask including a snake-shape pattern, forms a photoresist layer over fins on a substrate, exposes and develops to form a photoresist pattern in the photoresist layer corresponding to the snake-shape pattern, cuts the fins by transferring the photoresist pattern and etching cut parts of the fins. The snake-shape pattern may include a plurality of island patterns corresponding to the cut parts of the fins for removing the cut parts of the fins. By using the photomask including the snake-shape pattern, fin damage caused by exposing failure or over-exposing using a photomask only having island patterns or pot patterns can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of cutting fins, comprising:
   providing a photomask comprising a snake-shape pattern, wherein the snake-shape pattern comprises a plurality of island patterns;
   forming a photoresist layer over fins on a substrate, wherein when viewed from a top view, parts of the fins overlap with the island patterns;
   exposing and developing to form a photoresist pattern in the photoresist layer corresponding to the snake-shape pattern; and
   cutting the fins by transferring the photoresist pattern and etching cut parts of the fins, wherein after the etching cut, each cut fin is trapezoid-shaped.

2. The method of cutting fins according to claim 1, wherein the photoresist pattern comprises a snake-shape slot formed by the snake-shape pattern of the photomask.

3. The method of cutting fins according to claim 2, wherein the snake-shape slot overlaps the cut parts of the adjacent fins.

4. The method of cutting fins according to claim 3, wherein the snake-shape slot overlaps the cut parts of the two adjacent fins, so that the two adjacent fins are cut by removing the cut parts of the two adjacent fins.

5. The method of cutting fins according to claim 1, further comprising:
   removing the photoresist layer after the fins are cut.

6. The method of cutting fins according to claim 1, wherein the photomask comprises the plurality of snake-shape patterns to cut the fins respectively.

7. The method of cutting fins according to claim 1, wherein the snake-shape pattern is constituted by the plurality of island patterns for removing the cut parts of the fins.

8. The method of cutting fins according to claim 7, wherein the snake-shape pattern comprises corners with different curved angles to connect these island patterns.

* * * * *